United States Patent [19]

Clarke et al.

[11] Patent Number: 4,733,182

[45] Date of Patent: Mar. 22, 1988

[54] JOSEPHSON JUNCTION Q-SPOILER

[75] Inventors: John Clarke, Berkeley, Calif.; Claude Hilbert, Austin, Tex.; Erwin L. Hahn; Tycho Sleator, both of Berkeley, Calif.

[73] Assignee: The United States of America as represented by the United States Department of Energy, Washington, D.C.

[21] Appl. No.: 844,034

[22] Filed: Mar. 25, 1986

[51] Int. Cl.$^4$ ............................................. G01R 33/08
[52] U.S. Cl. ................................... 324/301; 324/311; 324/322; 307/306; 331/107 S
[58] Field of Search ............... 324/301, 316, 318, 322, 324/248, 331, 311; 333/175, 176 99 S; 331/107 S; 307/306

[56] References Cited

U.S. PATENT DOCUMENTS

| 3,725,819 | 4/1973 | Fulton | 331/107 S |
| 4,039,856 | 8/1977 | Schlig | 307/306 |

FOREIGN PATENT DOCUMENTS 244427  3/1967  U.S.S.R. ........................ 331/107 S

OTHER PUBLICATIONS

The Art of Electronics, P. Horowitz et al., Cambridge University Press 1980.
Nucleus Quadrupole Resonance Detected at 30 MHz with a SQUID, Appl. Phys. Lett. 47(6) Sep. 1985, pp. 637–639.

Primary Examiner—Stewart J. Levy
Assistant Examiner—Louis M. Arana
Attorney, Agent, or Firm—Clifton E. Clouse, Jr.; Roger S. Gaither; Judson F. Hightower

[57] ABSTRACT

An automatic Q-spoiler comprising at least one Josephson tunnel junction connected in an LC circuit for flow of resonant current therethrough. When in use in a system for detecting the magnetic resonance of a gyromagnetic particle system, a high energy pulse of high frequency energy irradiating the particle system will cause the critical current through the Josephson tunnel junctions to be exceeded, causing the tunnel junctions to act as resistors and thereby damp the ringing of the high-Q detection circuit after the pulse. When the current has damped to below the critical current, the Josephson tunnel junctions revert to their zero-resistance state, restoring the Q of the detection circuit and enabling the low energy magnetic resonance signals to be detected.

11 Claims, 7 Drawing Figures

JOSEPHSON JUNCTION Q-SPOILER

The United States Government has rights in this invention pursuant to Contract No. DE-AC03-76SF00098 between the U.S. Department of Energy and the University of California.

BACKGROUND OF THE INVENTION

The present invention relates to Josephson tunnel junction devices and more particularly to the use of Josephson tunnel junction devices in resonant circuits to provide automatic variance of the quality factor Q of the circuits.

The properties of various materials having particle systems with magnetic moments can conveniently be studied by methods such as nuclear magnetic resonance (NMR), electron spin resonance (ESR), nuclear quadrupole resonance (NQR), and similar systems. In general, a gyromagnetic particle system is irradiated by a high frequency (rf or microwave) pulse of a frequency which matches the natural processional frequency of the particles. After the pulse is turned off, the processing magnetization of the gyromagnetic particles will generate voltage signals across a pick-up coil which are then detected by a resonant circuit tuned to the frequency of the resonating system. The detected signal will have a magnitude proportional to the number of resonant particles in the system.

In order to detect the very weak signals from the resonating particles, a high-Q pick-up coil is needed. However, the strong exciting high frequency pulse will also be detected by the high-Q resonant circuit, and the consequent ringing of the high-Q resonant circuit will predominate for an appreciable time, masking detection of the weak, short-lived signals from the excited particles.

Attempts have been made to provide Q-spoilers which will reduce the Q of a resonant circuit when desired, such as to reduce the ringing from an excitation pulse, and which will allow the resonant circuit to have a high Q at other times, so that weak signals may then be detected. For instance, back-to-back diodes provide some cut-off, but the inherent forward resistance will limit the desirable high-Q of the circuit. Further, most Q-spoilers are complicated and unduly load the circuits in which they are used.

SUMMARY OF THE INVENTION

It is an object of the invention to provide a Q-spoiler for a resonant circuit which will cause the circuit to have a low Q when the resonant current of the circuit is high and which will cause the circuit to have a very high Q when the resonant current is very low.

It is a further object of the invention to use one or more Josephson tunnel junctions in a resonant circuit to switch the Q of the circuit automatically between high and low values in response to the magnitude of the resonant current.

It is a further object of the invention to provide a magnetic resonance detection system wherein a plurality of Josephson tunnel junctions are used to provide a high resistance for damping of a high frequency exciting pulse and a zero resistance for enabling the Q of the detection system to be very high for detection of weak signals from resonating particles.

Additional objects, advantages and novel features of the invention will be set forth in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

To achieve the foregoing and other objects and in accordance with the present invention, as described and broadly claimed herein, a resonant circuit, having inductive and capacitive components resonantly connected to each other, is provided with at least one Josephson tunnel junction connected in series with one of the reactive components.

A further aspect of the invention lies in the use of a detector means for detecting signals produced by magnetic resonance of gyromagnetic particles, the detector being coupled to the input of a dc SQUID amplifier by a resonant circuit having a plurality of Josephson tunnel junctions therein.

BRIEF DESCRIPTION OF THE DRAWINGS

The accompanying drawings, which are incorporated in and form a part of the invention, together with the description, serve to explain the principles of the invention.

DESCRIPTION OF PREFERRED EMBODIMENTS

Figure 1:
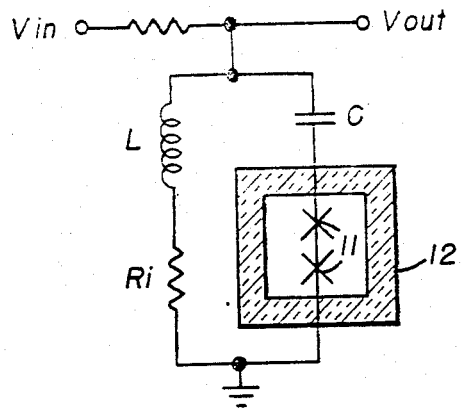
FIG. 1 illustrates a parallel resonant circuit with Josephson tunnel junctions therein, in accordance with the invention.

Referring now to the drawings, which illustrate preferred embodiments of the invention, FIG. 1 shows a filter circuit having an inductance L and a capacitor C connected together for parallel resonance, the resonant circuit being in series with a resistor R. The internal resistance of the inductance L is represented by the resistor $R_i$. In accordance with the present invention, one or more Josephson tunnel junctions 11 are connected in series with the inductance L and capcitor C for flow of resonant current therethrough. Although unshunted (hysteretic) junctions are preferred as being simpler and more efficient, shunted junctions can also be used in principle. The Josephson tunnel junctions 11 are disposed in a thermally insulated container 12 maintained at a superconductivity temperature, as by liquid helium.

It is a function of a Josephson tunnel junction 11 that when in the superconducting state, Cooper pairs of electrons with equal and opposite momenta, and with charge 2e, can tunnel through a thin insulating barrier separating two superconductors. Since the tunneling involves electron pairs, rather than single electrons, the current flows through the junction as a supercurrent, and no voltage appears between the superconductors, i.e. across the insulating barrier. However, if a current greater than the critical current $I_o$ is forced through the junction, a voltage will be developed across the barrier, and part of the current will flow dissipatively so that the junction functions as a resistor.

Figure 2:
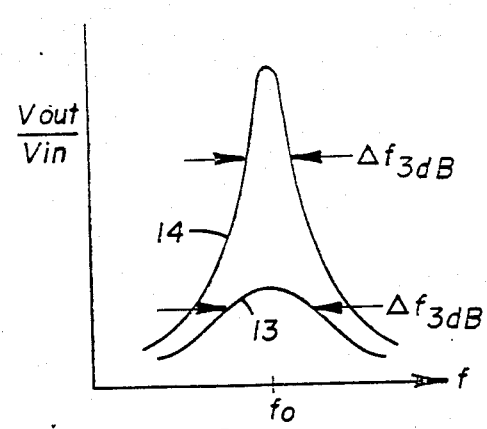
FIG. 2 illustrates the response of the circuit of FIG. 1 at resonant currents above and below the critical current of the Josephson tunnel junctions.

FIG. 2 illustrates the response of the filter circuit of FIG. 1, with the ratio of the output voltage, $V_{out}$, to the input voltage, $V_{in}$, being plotted against frequency. Operations below and above the critical current $I_o$ of the Josephson tunnel junctions 11 are represented by curves 13 and 14, respectively.

In either case, the ratio of $V_{out}$ to $V_{in}$ will peak at the resonant frequency $f_o = \frac{1}{2}\pi(LC)^{\frac{1}{2}}$. The quality factor Q of the circuit is a measure of the sharpness of the peak, and equals the resonant frequency divided by the width, $\Delta f$, at the $-3$ dB points.

If the input excitation voltage is sufficiently low so that less than the critical current is forced through the Josephson tunnel junctions 11, then the only resistance in the LC oscillating circuit is the internal resistance $R_i$ of the inductance L. The $V_{out}/V_{in}$ curve 13 will peak sharply. On the other hand, if the input voltage is high enough so that the current through the Josephson tunnel junctions exceeds the critical value, the tunnel junctions will act resistively. The added resistance will now cause the $V_{out}/V_{in}$ curve 14 to peak more broadly and at a lower value than before.

Additionally, if the input voltage is in the form of a pulse of energy, at the resonant frequency of the filter and of a magnitude sufficient to cause the current through the Josephson tunnel junctions to exceed the critical value, the resistance of the tunnel junctions will cause the oscillation, or ringing, of the circuit to diminish rapidly. When the oscillating LC current has been damped to a value below the critical current, the Josephson tunnel junctions will revert to their zero-resistance characteristic. Current will continue to pass through them as a supercurrent, but no voltage will appear across them. Therefore, they no longer act as series resistors in the resonant circuit, and the high Q of the circuit is re-established.

The number of Josephson tunnel junctions connected in series can be chosen so that, when acting as resistors, the tunnel junctions provide a value of resistance equal to or above that needed for critical damping of the resonant circuit.

Figure 3:
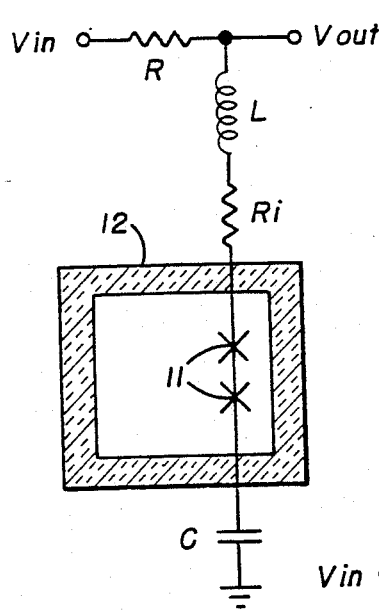
FIG. 3 illustrates a series resonant circuit with Josephson tunnel junctions therein, again in accordance with the invention.

FIG. 3 shows another embodiment of the invention, with one or more hysteretic Josephson tunnel junctions 11 being used in a filter circuit wherein the inductance L and capacitor C are connected for series resonance, with the Josephson junctions 11 again being connected for flow of resonant current therethrough.

Figure 4:
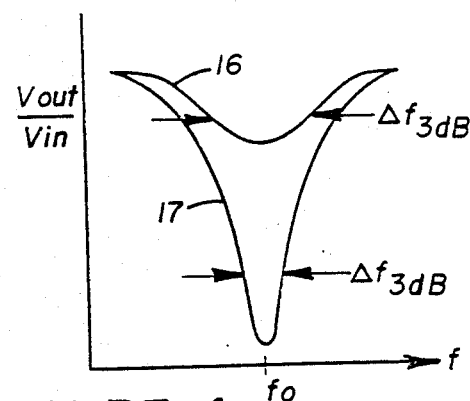
FIG. 4 illustrates the response of the circuit of FIG. 3 at resonant currents above and below the critical current of the Josephson tunnel junctions.

FIG. 4 illustrates the response of the filter circuit of FIG. 3, with curves 16 and 17 representing the ratio of $V_{out}/V_{in}$ plotted against frequency for operations above and below the critical current $I_o$ of the Josephson tunnel junctions 11. In either case, the impedance of the LC circuit will be at a minimum at the resonant frequency, $f_o = \frac{1}{2}\pi(LC)^{\frac{1}{2}}$. As before, when the current through the Josephson tunnel junctions 11 exceeds the critical current, a voltage will appear across the junctions and the resistance of the resonant circuit will be the inherent resistance $R_i$ of the inductance L and the effective resistance across the Josephson junctions. Likewise, when the current through the Josephson junctions is less than the critical value, these junctions will be in a zero-resistance state and the resistance of the resonant circuit will be $R_i$ alone. As a consequence, the Q of the resonant circuit will be lower at operations above the critical current than it is at operations below the critical current.

Also, as before, if an input signal $V_{in}$ is applied to the filter of a magnitude to cause the LC circuit to resonate with the resonant current exceeding the critical current and the input signal is removed, oscillation of the LC circuit will be damped by the combined internal resistance $R_i$ of the inductance plus the effective resistance of the Josephson tunnel junctions. When the resonant current has damped to a value below critical, the Josephson tunnel junctions will revert to their zero-resistance state, and the high-Q of the resonant circuit will be re-established.

Figure 5:
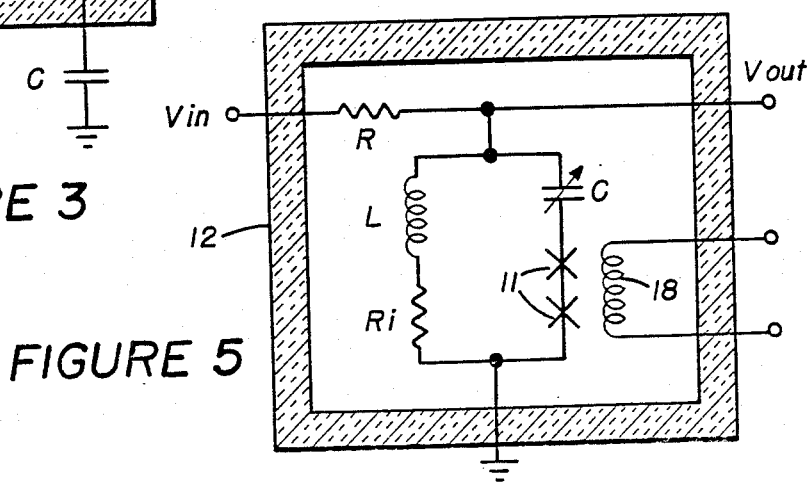
FIG. 5 illustrates a modification of the resonant circuit shown in FIG. 1.

FIG. 5 illustrates several alternative modifications of the invention. For example, the entire filter circuit may be located within the insulated supercooled container 12. Further, the capacitor C may be variable so that the LC circuit can be adjusted to resonate at a desired frequency. Additionally, the switching threshold of the Josephson tunnel junctions may be varied by means of a coil 18 located with respect to the Josephson junctions 11 so that dc current through the coil 18 will generate a static magnetic field parallel to the plane of the insulating barriers of the junctions. Any of these modifications can, of course, be used with the circuits of FIGS. 1 or 3.

Figure 6:
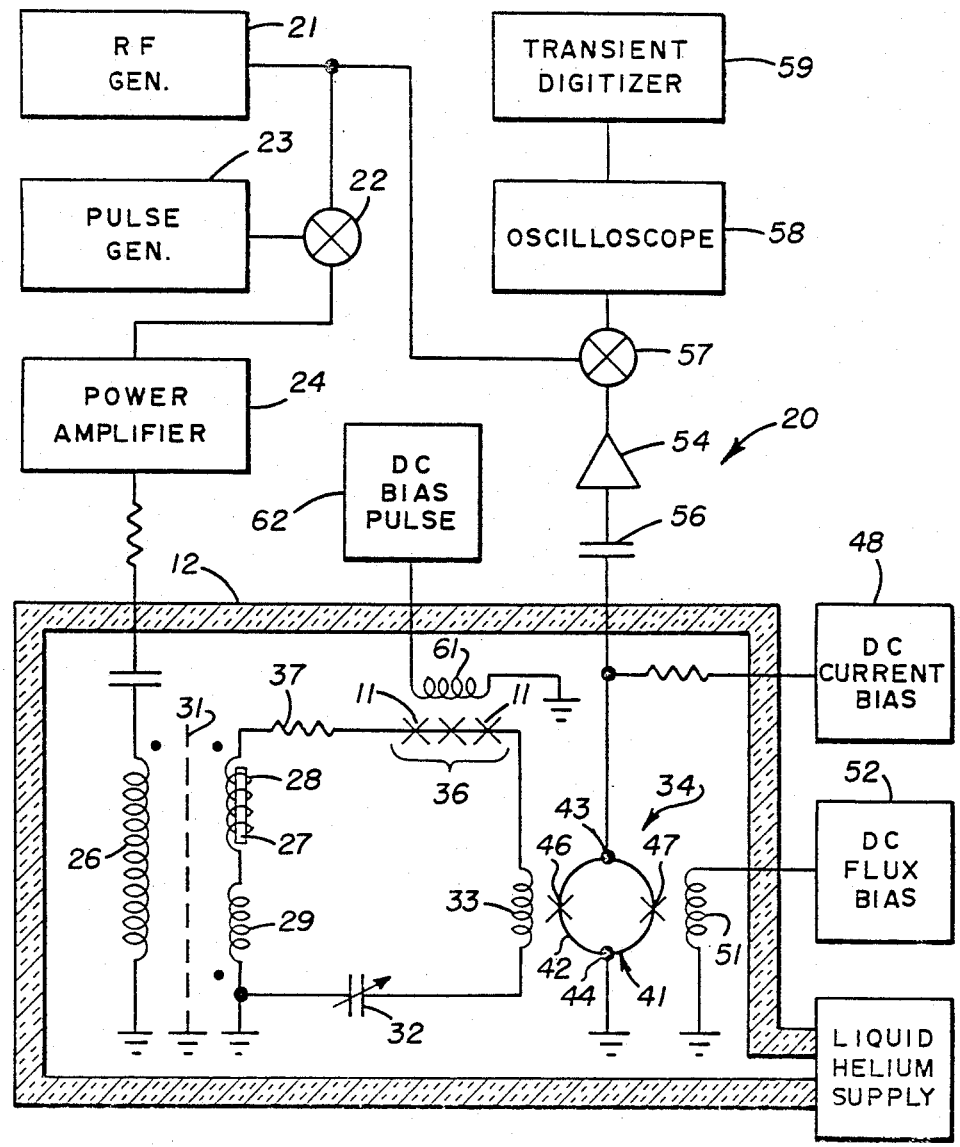
FIG. 6 is a block and schematic diagram of a nuclear resonance detection system made in accordance with the invention.

FIG. 6 illustrates the use of the invention in the detection of pulsed magnetic resonance. In particular, FIG. 6 shows a system 20 for detection of nuclear quadruple resonance (NQR) of a $NaClO_3$ specimen. At 4.2K the C1 nuclei exhibit a quadrupole resonance at 30.6856 MHz.

An rf generator 21 feeds a continuous sinusoidal signal into a gate 22 that is triggered by a pulse generator 23. The resulting rf pulse is amplified by power amplifier 24 and coupled into the cold transmitter coil 26 by an impedance matching circuit. The specimen 27 is located inside a pick-up coil 28 that is connected in series with an identical, oppositely wound coil 29. Both coils 28 and 29 are actually situated inside the transmitter coil 26 and can be moved along their mutually concentric axis so as to minimize their inductive coupling to the transmitter coil 26. In addition, a grounded Faraday shield 31 between the transmitter and pick-up coils minimizes capacitive coupling. After the rf pulse is turned off, the precessing magnetization of the nuclei in the specimen 27 will induce a signal voltage across the pick-up coil 28. The pick-up coils are connected in series with an adjustable capacitor 32, the input coil 33 of the rf amplifier 34, and a series array 36 of Josephson tunnel junctions 11. The resistor 37 represents the inherent resistance and losses of the circuit.

The rf amplifier 34 is preferably one using a dc superconducting quantum interference device (SQUID), as more fully disclosed in U.S. patent application of Claude Hilbert, John M. Martinis, and John Clarke, Ser. No. 604,547, filed on Apr. 27, 1984, and now U.S. Pat. No. 4,585,999, the disclosure of which is incorporated herein by reference. As described therein, the dc SQUID 41 has a planar thin-film ring 42 with bias current input and output portions 43 and 44 each between the two shunted Josephson junctions 46 and 47 in the ring. The input coil 33 is also of planar configuration and in the form of a spiral ring in close parallel relation to the superconducting SQUID ring 42. A dc current bias source 48 is connected to the bias current input 43 of the SQUID ring 42 and operates the dc SQUID with a bias current greater than its critical current, thus maintaining a non-zero voltage across each Josephson junction 46 and 47. A flux coil 51 is supplied with constant dc current from the dc flux bias source 52 to establish a constant magnetic flux threading the SQUID ring 41.

The gradiometerlike configuration of the transmitter and pick-up coils helps to protect the dc SQUID 41 from the rf pulses. If too large a current is induced into the input coil 33, flux in the Josephson junctions of the SQUID could be trapped or the input coil could even be driven normal with permanent damage to the SQUID.

The SQUID output is matched to a low noise, room-temperature amplifier 54 by capacitor 56 that, together with the coaxial line from the SQUID transforms the output resistance to 50$\Omega$. The amplified signal is mixed down by a double balanced mixer 57 with a reference supplied by the rf generator 21. The mixed-down signal is passed to an oscilloscope 58 for observation and to a transient digitizer 59 wherein digital information is generated for storage in a computer where it may be used for further analysis or averaging.

In one actual embodiment of the system of FIG. 6, the array 36 of hysteretic Josephson tunnel junctions comprised twenty 10×10 $\mu$m Nb-NbOx-PbIn tunnel junctions, each junction having a critical current of about 4 $\mu$A, and a hysteretic current-voltage characteristic with a resistance of about 50$\Omega$ at voltage above the sum of the energy gaps. For signal currents below the critical current, the array has zero resistance. On the other hand, the relatively large current induced by each rf pulse causes the junctions to switch rapidly to the resistive state with a total resistance of about 1 k$\Omega$. Thus, the array acts as a Q spoiler to provide additional protection for the SQUID 41. Further, and importantly, the additional resistance of the junction array 36 greatly reduces the ring-down time of the tuned circuit after the end of the applied rf pulse.

A plurality of Josephson tunnel junctions 11 is used to avoid damage to the junction if a single junction were used and also to obtain sufficient damping. The quality factor Q is about ½ with the junctions in the resistive state.

A flux coil 61, excited by a dc pulse from source 62, is positioned to apply a static magnetic field (suitably shielded from specimen 27) parallel to the plane of the films of the tunnel junctions. This enables the time of recovery of the circuit from the rf pulse to be further reduced by applying a pulse of magnetic field to the junctions to reduce their critical current to zero until just after the rf pulse has been turned off.

Figure 7:
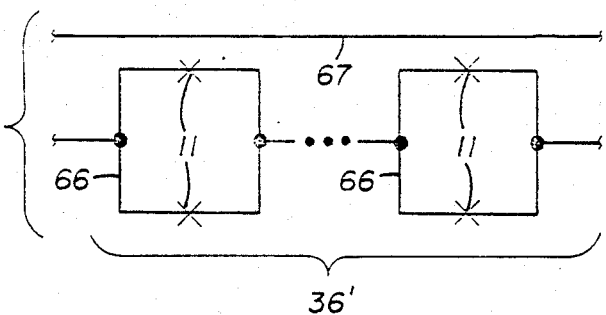
FIG. 7 illustrates an alternative array of series connected Josephson tunnel junctions.

If desired, the array 36 of Josephson junctions may be replaced by an array 36' (FIG. 7) of superconducting interferometers 66 connected in series, each interferometer 66 comprising two Josephson tunnel junctions 11 connected in parallel. A single control line 67, supplied with dc current (as from source 62) and running past all of the interferometers, is used to establish a magnetic flux which threads the loops of the interferometers. The amount of flux is adjusted to modulate the critical current $I_o$ to a desired amount. As before, such an array 36' will limit the current in the system to protect the SQUID amplifier 34 during the high frequency excitation pulse, and will decrease the Q of the tuned circuit to reduce the ring-down time after the end of the excitation pulse.

As may be seen from the foregoing, the present invention provides a small-signal amplifier for NQR based on a dc SQUID and a Josephson tunnel junction Q spoiler that combines a very high sensitivity with a good tolerance for large rf pulses. The system offers several advantages over conventional systems with room-temperature amplifiers: (1) an improvement in voltage resolution of 1–2 orders of magnitude, due to the low noise temperature of the SQUID and the fact that a high Q circuit can be used; (2) the virtual elimination of any amplifier dead time, because the SQUID itself recovers from the rf pulse within a few Josephson oscillations (<1 ns): (3) the elimination of losses in the tuned circuit arising from the cable connecting it to a room-temperature amplifier; (4) a wide tuning range, from ~1 to 300 MHz.

The foregoing description of preferred embodiments has been presented for purposes of illustration and description. It is not intended to be exhaustive or to limit the invention to the precise forms described, and obviously many modifications and variations are possible in light of the above teaching. The embodiments were chosen in order to explain most clearly the principles of the invention and its practical applications thereby to enable others in the art to utilize most effectively the invention in various other embodiments and with various other modifications as are suited to the particular use contemplated. For example, the Josephson tunnel junction Q spoiler could be used in conjunction with any low-temperature circuit for the detection of pulsed magnetic resonance, whether or not the amplifier incorporates a SQUID. Further, a similar system to the one described herein could be used for NMR, with the proviso that the SQUID would have to be shielded from the static magnetic field applied to the sample and pick-up coils. Also, a similar system could be used for detection of gyroprecessional resonance of electric dipole systems wherein the specimen is effectively coupled to a capacitor. It is intended that the scope of the invention be defined by the claims appended hereto.

We claim:

1. In a resonant circuit having inductive and capacitive components resonantly connected to each other for flow of resonant current through each other, the improvement comprising at least one Josephson tunnel junction connected in series with one of said components for flow of the same resonant current through said junction that flows through said inductive and capacitive components.

2. The invention as set forth in claim 1, wherein said inductive and capactive components are connected to each other for parallel resonance.

3. The invention as set forth in claim 1, wherein said inductive and capacitive components are connected to each other for series resonance.

4. The invention as set forth in claim 1, and further including means for applying a static magnetic field parallel to the plane of said Josephson tunnel junctions.

5. The invention as set forth in claim 1, wherein there are a plurality of unshunted Josephson tunnel junctions connected in series with each other.

6. The invention as set forth in claim 5, and further including means for applying a static magnetic field parallel to the plane of said Josephson tunnel junctions.

7. A detection system for detecting the gyroprecessional resonance of a specimen having a particle system with magnetic or electric dipole moments, said detection system comprising:

means for irradiating said specimen with a pulse of high frequency radiation, detector means for detecting signals produced by magnetic resonance of said specimen, a dc SQUID having a superconducting ring and two shunted Josephson tunnel junctions interrupting said ring, said ring having a bias current input at one side thereof between said junctions and a bias current output at the other side thereof between said junctions, means for establishing a constant magnetic flux threading said SQUID ring, means for supplying a bias current to said bias current input of said SQUID, an input coil inductively coupled to said SQUID ring, and a resonant circuit coupling said detector means to said input coil, said resonant circuit having inductive and reactive components and at least one Josephson tunnel junction connected in series with one of said components.

8. A detection system as set forth in claim 7, and further including means for applying a static magnetic field parallel to the plane of said Josephson junction.

9. A detection system as set forth in claim 7, wherein there are a plurality of unshunted Josephson tunnel junctions connected in series.

10. A detection system as set forth in claim 8, and further including means for applying a static magnetic field parallel to the plane of said Josephson junctions.

11. A detection system as set forth in claim 7, wherein there are a plurality of Josephson tunnel junctions connected in series with one of said components, said plurality of Josephson junctions being connected as a plurality of superconducting interferometers, said interferometers being connected in series and with each interferometer comprising two Josephson junctions connected in parallel, and further including means for establishing a desired amount of magnetic flux threading the loops of the interferometers.

* * * * *